US009014281B2

United States Patent
Cho et al.

(10) Patent No.: US 9,014,281 B2
(45) Date of Patent: Apr. 21, 2015

(54) DELTA-SIGMA MODULATOR AND TRANSMITTER INCLUDING THE SAME

(71) Applicant: Electronics and Telecommunications Research Institute, Daejeon (KR)

(72) Inventors: Young Kyun Cho, Daejeon (KR); Sung Jun Lee, Daejeon (KR); Seung Hyun Jang, Daejeon (KR); Bong Hyuk Park, Daejeon (KR); Jae Ho Jung, Daejeon (KR); Kwang Chun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/011,268

(22) Filed: Aug. 27, 2013

(65) Prior Publication Data
US 2014/0064355 A1    Mar. 6, 2014

(30) Foreign Application Priority Data

Aug. 27, 2012  (KR) .................. 10-2012-0093478

(51) Int. Cl.
*H04L 25/49*        (2006.01)
*H03K 7/08*         (2006.01)
(Continued)

(52) U.S. Cl.
CPC .............. *H04L 25/4902* (2013.01); *H03K 7/08* (2013.01); *H04B 14/062* (2013.01); *H03M 3/504* (2013.01)

(58) Field of Classification Search
CPC ..... H04L 27/2626; H04L 27/36; H04L 27/12; H04L 27/20; H04L 27/3411; H04L 7/0091; H04L 1/1967; H04L 27/04; H03M 1/00; H03M 1/12; H03M 3/43; H03M 1/1245; H03M 2201/64; H03M 3/458; H03M 2201/20; H03M 1/124; H03M 2201/13; H03M 2201/51; H03M 2201/11; H03M 3/39; H03M 1/02; H03M 7/3004; H03M 3/432; H03M 7/3051; H03F 1/07; H03F 2200/331; H04N 5/40

USPC ......... 375/219, 221, 243, 244, 245, 247, 252, 375/268, 295, 296, 300; 341/110, 122, 126, 341/131, 143, 144, 150
See application file for complete search history.

(56) References Cited

U.S. PATENT DOCUMENTS 5,068,659 A * 11/1991 Sakaguchi .................... 341/143
7,098,827 B2 * 8/2006 Motz ............................. 341/143
(Continued)

FOREIGN PATENT DOCUMENTS

KR        1020100069126          6/2010

OTHER PUBLICATIONS

Kim, Joon Hyung et al., "60% High-Efficiency 3G LTE Power Amplifier with Three-level Delta Sigma Modulation Assisted by Dual Supply Injection," 2011 IEEE MTT-S International Microwave Symposium Digest (MTT), pp. 1-4 (2011).

*Primary Examiner* — Dac Ha
(74) *Attorney, Agent, or Firm* — Nelson Mullins Riley & Scarborough LLP

(57) ABSTRACT

A delta-sigma modulator and a transmitter apparatus including the same are disclosed. The delta-sigma modulator includes a first integrator, a second integrator, a first comparator configured to compare an output signal of the second integrator and a reference signal, and output a first comparison signal, a second comparator configured to compare the output signal of the second integrator and the reference signal, and output a second comparison signal, a first DAC configured to output the first signal corresponding to the first comparison signal and the second comparison signal, a second DAC configured to output the second signal corresponding to the first comparison signal and the second comparison signal, a delayer configured to generate a delayed signal that delays the first comparison signal and the second comparison signal by a predetermined time, and an output DAC configured to generate an output signal having a multi-level corresponding to the delayed signal.

6 Claims, 6 Drawing Sheets

(51) Int. Cl.
*H04B 14/06* (2006.01)
*H03M 3/00* (2006.01)

(56) References Cited

U.S. PATENT DOCUMENTS 8,570,201 B2 * 10/2013 Ashburn et al. ............... 341/143

| | | |
|---|---|---|
| 2007/0160164 A1 | 7/2007 | Sahota |
| 2010/0150262 A1 | 6/2010 | Kim et al. |
| 2010/0156686 A1 * | 6/2010 | Kim et al. .................... 341/143 |
| 2011/0309959 A1 * | 12/2011 | Hode et al. ................... 341/110 |
| 2012/0200437 A1 * | 8/2012 | Moue ............................ 341/110 |
| 2013/0044013 A1 * | 2/2013 | Braswell ....................... 341/110 |
| 2013/0194116 A1 * | 8/2013 | Oliaei et al. .................. 341/110 |

* cited by examiner (A)

(B)

DELTA-SIGMA MODULATOR AND TRANSMITTER INCLUDING THE SAME

CLAIM FOR PRIORITY

This application claims priority to Korean Patent Application No. 10-2012-0093478 filed on Aug. 27, 2012 in the Korean Intellectual Property Office (KIPO), the entire contents of which are hereby incorporated by reference.

BACKGROUND

1. Technical Field

Example embodiments of the present invention relate in general to a wireless communication apparatus and more specifically to a delta-sigma modulator and a transmitter including the same that may be applied to a broadband transmitter apparatus.

2. Related Art

A next generation wireless communication system, such as a third generation partnership project (3GPP), a long term evolution (LTE), and a worldwide interoperability for microwave access (WiMAX) of the Institute of Electrical and Electronics Engineers (IEEE), uses a modulated broadband signal through an orthogonal frequency division multiplexing (OFDM) for high spectrum efficiency.

However, in a system using the OFDM such as the LTE and the WiMAX, etc., in case of using a general linear amplifier for signal transmission, there is a problem that power efficiency is decreased due to a high peak to average power ratio (PAPR).

To solve the above problem, studies for maximizing the power efficiency through a power amplifier, such as a Doherty amplifier, an envelope tracking amplifier, etc., have been conducted.

However, since the Doherty amplifier and the envelope tracking amplifier, etc. have a feature that a non-constant envelope signal is applied as an input, when a signal having the high PAPR is applied as the input of the amplifier, there is a problem that nonlinearity of the amplifier increases. Therefore, the power amplifiers have a limit to increase the efficiency.

To solve the problem of the general power amplifier, a transmitter apparatus using a switching amplifier was proposed.

An input signal of the switching amplifier is limited as an envelope signal having a constant amplitude, and in order to produce the input signal, methods such as an envelope delta sigma modulation (EDSM) and an envelope pulse width modulation, etc., were proposed. The switching amplifier always operates in a saturation region using the above input signal encoder, and guarantees linearity for the non-constant envelope signal, thereby obtaining high switching efficiency.

As described above, a structure of the transmitter apparatus using the modulated input signal is called a Class-S structure.

A conventional Class-S structure transmitter apparatus has a structure that a polar coordinate converter separates an input signal into a phase signal and an envelope signal, converts the envelope signal into a pulse-width modulated signal through a low pass delta-sigma modulation and the phase signal into a phase modulated signal through a phase modulation, after this, a mixer produces a sine wave-type signal having the same amplitude by mixing the pulse-width modulated signal and the phase modulated signal, and then a power amplifier is driven by the sine wave-type signal.

However, the conventional Class-S structure transmitter apparatus has a problem that a signal delay is inevitably generated due to an integrator included in a delta-sigma modulator. The signal delay is generated in proportion to the order of the delta-sigma modulator, and if the signal delay occurs, timings of the phase modulated signal and the pulse-width modulated signal at a time point when the both signals are mixed are not matched. That is, the conventional Class-S structure transmitter apparatus has a problem that timings at a time point when dividing the phase signal and the envelope signal and timings at a time point when mixing the modulated signals thereof are mismatched, and then signal quality grows worse.

Meanwhile, the signal quality of the conventional Class-S structure transmitter apparatus is mostly determined by the delta-sigma modulator, and in particular, shows a remarkable difference according to the order and an output level, etc. of the delta-sigma modulator. Accordingly, to maximize the signal quality of the transmitter apparatus, it is necessary to optimize the order and the output level of the delta-sigma modulator.

Further, in the delta-sigma modulator having the same order and output level, the higher an oversampling ratio (OSR) is, the higher a signal to quantization noise ratio (SQNR) becomes. Accordingly, in order to increase much more the signal quality of the transmitter apparatus, it is necessary to increase the OSR of the delta-sigma modulator.

SUMMARY

Accordingly, example embodiments of the present invention are provided to substantially obviate one or more problems due to limitations and disadvantages of the related art.

Example embodiments of the present invention provide a delta-sigma modulator which can improve performance and efficiency of a transmitter apparatus.

Example embodiments of the present invention also provide a transmitter apparatus including the sigma-delta modulator.

In some example embodiments, a delta-sigma modulator includes: a first integrator configured to integrate an input signal and a first signal which is fed back; a second integrator configured to integrate an output signal of the first integrator and a second signal which is fed back; a first comparator configured to compare an output signal of the second integrator and a reference signal, and output a first comparison signal; a second comparator configured to compare the output signal of the second integrator and the reference signal, and output a second comparison signal; a first digital to analog converter (DAC) configured to output the first signal corresponding to the first comparison signal and the second comparison signal; a second DAC configured to output the second signal corresponding to the first comparison signal and the second comparison signal; a delayer configured to generate a delayed signal that delays the first comparison signal and the second comparison signal by a predetermined time; and an output DAC configured to generate an output signal having a multi-level corresponding to the delayed signal.

The delta-sigma modulator may further include a differential clock generator configured to generate a clock signal having a clock frequency corresponding to a bandwidth of the input signal and a predetermined oversampling ratio (OSR). Further, the delta-sigma modulator is constituted as a continuous-time type that the first integrator and the second integrator include a resistor and a capacitor. Moreover, the delta-sigma modulator may further include a time constant compensator configured to compensate values of a resistor and a capacitor included in the first integrator and the second integrator. The delta-sigma modulator may further include an offset compensator configured to compensate a DC offset. The delta-sigma modulator may further include a zero optimizer configured to form a feedback path from an output of the second integrator to an input of the first integrator, and optimize a zero.

In other example embodiments, a transmitter apparatus, includes: a polar coordinate converter configured to separate an input signal into a phase signal and an envelope signal, and output the phase signal and the envelope signal; a phase modulator configured to perform phase modulation on the phase signal, and output a phase modulated signal having a constant amplitude; a delta-sigma modulator configured to constitute as a second order, perform delta-sigma modulation on the envelope signal, and output a pulse-width modulated signal having three voltage levels; a mixer configured to mix the phase modulated signal and the pulse-width modulated signal, and output the mixed signal; and a power amplifier configured to perform power amplification on the mixed signal.

The delta-sigma modulator may delay and output the pulse-width modulated signal having three voltage levels by a predetermined time.

The delta-sigma modulator may include a differential clock generator configured to generate a clock signal having a clock frequency corresponding to a bandwidth of the input signal and a predetermined oversampling ratio.

The delta-sigma modulator may be constituted as a continuous-time type.

The transmitter apparatus may further include a voltage controller configured to control a delay of a supply voltage provided to the power amplifier based on the delayed pulse-width modulated signal output from the delta-sigma modulator.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1:
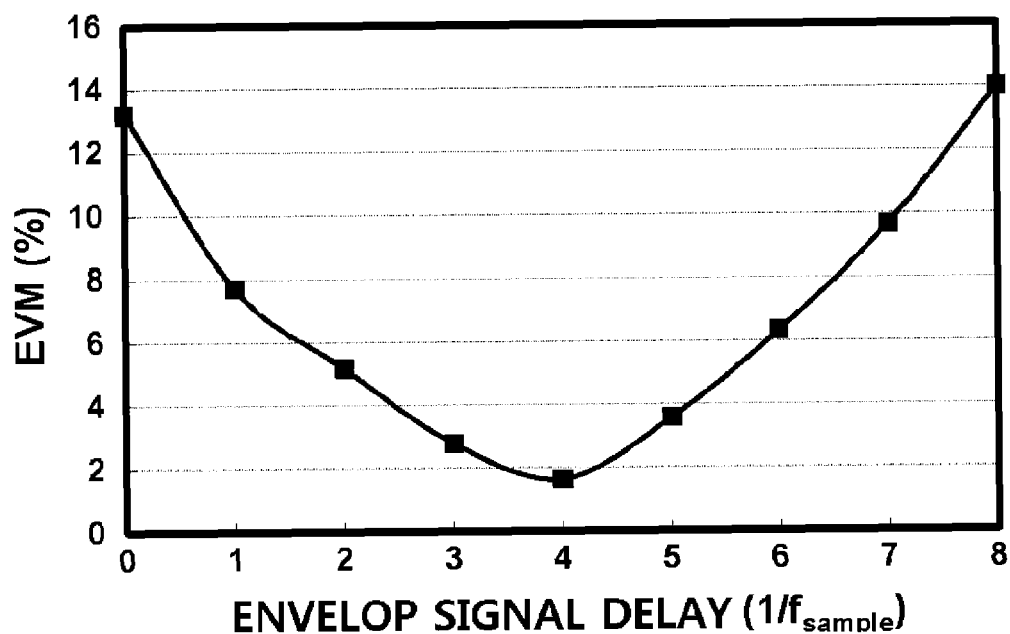
FIG. 1 is a graph illustrating error vector magnitude (EVM) characteristics through delay compensation of a delta-sigma modulator.

Example embodiments of the present invention are disclosed herein. However, specific structural and functional details disclosed herein are merely representative for purposes of describing example embodiments of the present invention, and thus example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of examples in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in reverse order, depending upon the functionality/acts involved.

There are two major factors determining performance and efficiency of a transmitter apparatus. The first factor is output spectrum characteristics which can evaluate the performance and the efficiency of the transmitter apparatus using spectrum mask characteristics or adjacent channel leakage power ratio (ACLR) characteristics.

A delta-sigma modulator used in a Class-S structure transmitter apparatus has an effect on output spectrum characteristics of the transmitter apparatus. If the delta-sigma modulator has the same order and output level, the higher an oversampling ratio (OSR) is, the higher the output spectrum characteristics becomes. That is, if the delta-sigma modulator has a high signal to quantization noise ratio (SQNR), the output spectrum characteristics may be improved much more.

The second factor determining the performance and the efficiency of the transmitter apparatus is signal quality characteristics which can be evaluated by error vector magnitude (EVM) characteristics. Generally, in order to improve the output spectrum characteristics of the transmitter apparatus, a method of increasing the SQNR of a delta-sigma modulator may be largely used, but signal quality may not be improved only by simply increasing the SQNR. In particular, an input signal used in an LTE system may be mostly converged around a direct current (DC), an intensity of the signal may be attenuated according to a bandwidth, and the input signal may have amplitude to a certain extent even the outside of the bandwidth. Accordingly, in order to increase the SQNR, in case of increasing the order of the delta-sigma modulator, quantization noise of the outside of the bandwidth may be increased and the signal quality may grow worse.

Accordingly, a structure and components of the delta-sigma modulator used in a Class-S structure transmitter apparatus may be desirable to determine by considering the signal quality characteristics, and to design to have the OSR which can maximize the SQNR in the order and output level of the determined delta-sigma modulator.

A delta-sigma modulator according to an embodiment of the inventive concept has a structure considering following items in order to improve the signal quality of the transmitter apparatus.

Firstly, in case of using a delta-sigma modulator in a Class-S structure transmitter apparatus, a delay of an envelope signal may occur by an integrator circuit included in the delta-sigma modulator. Further, in case of manufacturing the delta-sigma modulator by a semiconductor process, an additional delay may occur by process conditions, connections between circuit blocks, or an output digital to analog converter (DAC).

As described above, when the delayed envelope signal is mixed with a phase signal in a mixer, a timing error may occur, and then the signal quality may grow worse. Accordingly, the delay of the envelope signal may need to be compensated.

Further, a delay time generated in the delta-sigma modulator may be proportional to a clock frequency used in the delta-sigma modulator. Generally, in order to increase signal spectrum efficiency of the transmitter apparatus, since the transmitter apparatus may use a clock frequency of the delta-sigma modulator twofold to twentyfold higher than that of a polar coordinate converter, there is a limit to control a signal in the polar coordinate converter.

Accordingly, compensation of the delay time generated in the delta-sigma modulator may be desirable to use a method of significantly delaying the phase signal in the polar coordinate converter, and compensating a fine delay in the delta-sigma modulator. In case of configuring a circuit for compensating the delay time inside of the delta-sigma modulator, the delay time may be adjusted at intervals of a sampling frequency, and an effect according to the order and the signal delay of the delta-sigma modulator may be attenuated.

FIG. 1 is a graph illustrating error vector magnitude (EVM) characteristics through delay compensation of a delta-sigma modulator. FIG. 1 shows error vector magnitude (EVM) characteristics (Y axis) according to an envelope signal delay compensation time (X axis) in case of the delta-sigma modulator that has a second order structure.

As shown in FIG. 1, the EVM characteristics in case of compensating a delay time of an envelope signal may be improved about eight times more than those in case of not compensating the delay time of the envelope signal.

Meanwhile, a circuit for compensating the delay time of the envelope signal may be desirable to adjust an output by the unit clock (i.e., 1/operation frequency). However, since the delay time of a layout and an output buffer of the delta-sigma modulator has a much shorter time than the unit clock time, the circuit may be desirable to design to be able to adjust a time shorter than the unit clock time using an additional delay compensation circuit.

Next, the delta-sigma modulator according to an embodiment of the inventive concept may consider a DC offset removal. In case of manufacturing the delta-sigma modulator by a semiconductor process, a mismatch of devices may occur depending on process conditions and a circuit design, and the DC offset may appear.

In the delta-sigma modulator used in a conventional transmitter apparatus, an affect of the offset generated in a low frequency band through a band pass filter may be removed. However, since an input signal may be mostly converged around a direct current (DC), in case of removing the offset using the same method as the conventional transmitter apparatus, the input signal may be also removed, thereby lowering ACLR and quality characteristics of the input signal.

Accordingly, in the Class-S structure transmitter apparatus, it may be desirable to remove the DC offset by a self circuit configuration in the delta-sigma modulator.

Figure 2:
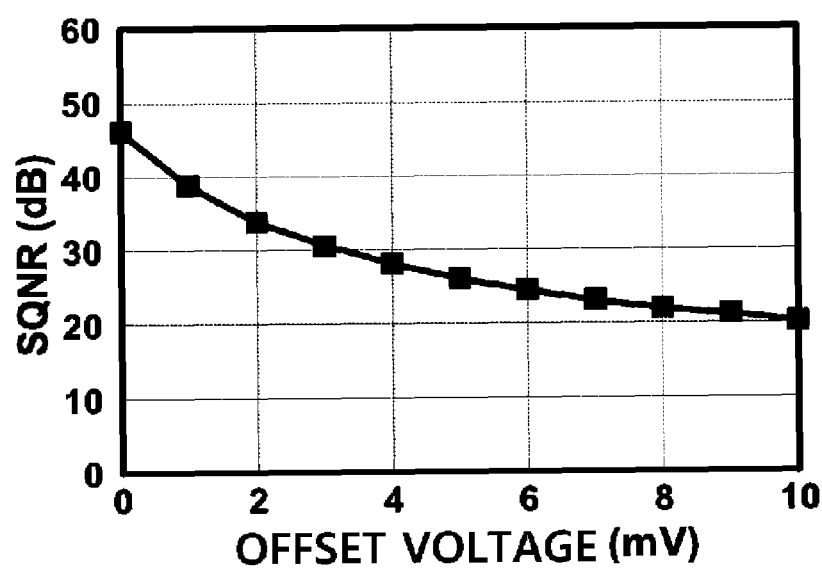
FIG. 2 is a graph illustrating signal to quantization noise ratio (SQNR) characteristics of a delta-sigma modulator according to an offset voltage.

FIG. 2 is a graph illustrating signal to quantization noise ratio (SQNR) characteristics of a delta-sigma modulator according to an offset voltage. As shown in FIG. 2, the more the offset voltage is increased, the more the SQNR of the delta-sigma modulator may be decreased. For example, the SQNR may be decreased more than 10 dB with respect to the input offset voltage of about 2 mV.

Meanwhile, the delta-sigma modulator used in the Class-S structure transmitter apparatus may be desirable to use a continuous-time type delta-sigma modulator which can support a clock frequency higher than that of a discrete-time type delta-sigma modulator having high ACLR characteristics in the same bandwidth. As described above, when the both modulators have the same order and an output level, the higher the OSR is, the more output spectrum characteristics may be improved. Accordingly, the delta-sigma modulator used in the Class-S structure transmitter apparatus may be desirable to design to have a continuous-time structure in order to improve the output spectrum.

An integrator used in the continuous-time type delta-sigma modulator may be implemented by an active RC structure, a gm-C structure, and a passive RC structure, etc. The integrators having those structures may include a resistor and a capacitor. Accordingly, in case of manufacturing the integrator by a semiconductor process, a parameter value may be varied up to thirty percent maximally, a time constant considered when being designed may be greatly varied, and thus the delta-sigma modulator may not normally operate.

Accordingly, the continuous-time type delta-sigma modulator used in the Class-S structure transmitter apparatus may be desirable to have an additional circuit for compensating values of the resistor and the capacitor.

Figure 3:
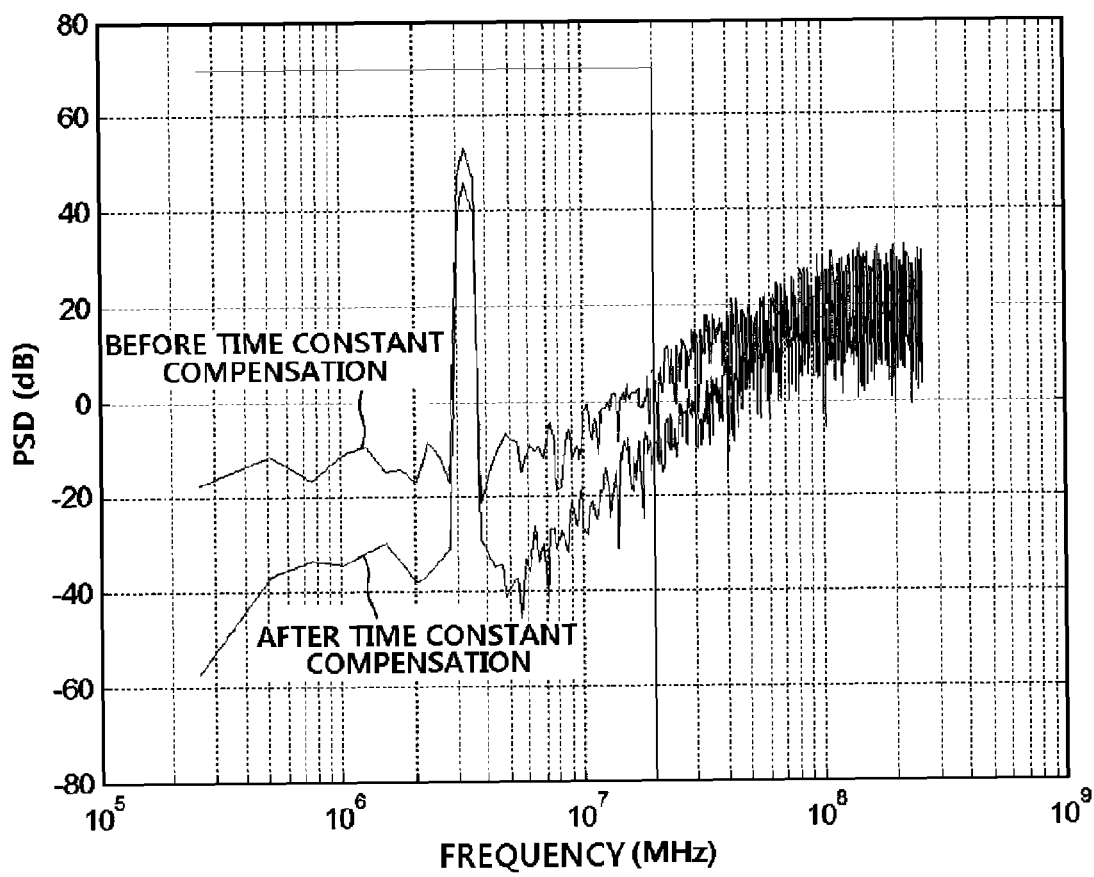
FIG. 3 is a graph illustrating a fast Fourier transform (FFT) result according to time constant compensation of a delta-sigma modulator used in a Class-S transmitter apparatus.

FIG. 3 is a graph illustrating an FFT result according to time constant compensation of a delta-sigma modulator used in a Class-S transmitter apparatus.

As shown in FIG. 3, when the integrator of the continuous-time type delta-sigma modulator consists of a resistor and a capacitor, the SQNR (=45 dB) when compensating the time constant may be higher than the SQNR (=30 dB) when not compensating the time constant.

Further, an important factor which has to be considered in the delta-sigma modulator used in the Class-S structure transmitter apparatus may be the order and a quantization level (or, output level) of the delta-sigma modulator. According to the order and the quantization level, overall noise shaping of a processed signal in the delta-sigma modulator may be determined, and signal performance and quality of the Class-S structure transmitter apparatus including the delta-sigma modulator may be determined.

Figure 4:
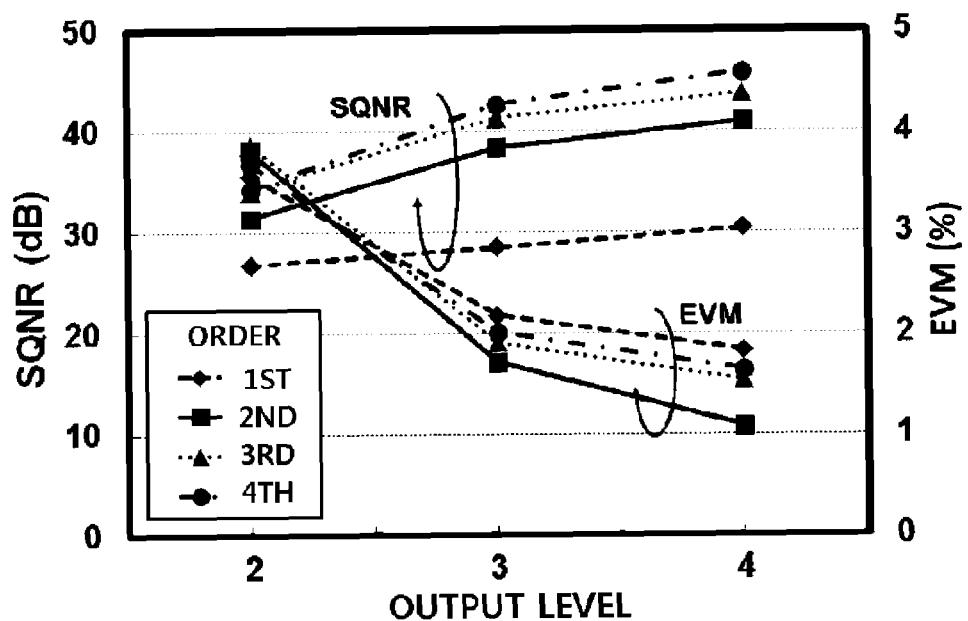
FIG. 4 is a graph illustrating SQNR and EVM characteristics according to the order and an output level of a delta-sigma modulator.

FIG. 4 is a graph illustrating SQNR and EVM characteristics according to the order and an output level of a delta-sigma modulator. FIG. 4 illustrates SQNR and EVM characteristics according to the order and output level of the delta-sigma modulator in case of applying an LTE signal having a bandwidth of 20 MHz to the delta-sigma modulator.

As shown in FIG. 4, the more the order and quantization level is increased, the more the SQNR may be increased. However, as described above, a high SQNR may not guarantee high signal quality (i.e., low EVM characteristic). That is, the LTE signal having the bandwidth of 20 MHz may have a maximum spectrum density at a low frequency, be decreased in amplitude around the bandwidth of 20 MHz, and have amplitude to a certain extent even the outside of the bandwidth of 20 MHz. Meanwhile, a noise spectrum density of the delta-sigma modulator may have characteristics that a noise density at a frequency of the outside of the bandwidth according to increase of the order is abruptly increased. The noise density characteristics abruptly increased at a frequency of the outside of the bandwidth may be a major reason to lower the signal quality of the delta-sigma modulator, and thereby the EVM may be increased.

Accordingly, as shown in FIG. 4, since the delta-sigma modulator may have the highest signal quality when the output level is more than 3 and the order is 2, the delta-sigma modulator used in the Class-S structure transmitter apparatus may be desirable to have a second order structure.

On the other hand, when considering the signal quality characteristics according to the output level, even though the signal quality is improved as the output level is increased, a cost to operate a power amplifier in a saturation region which operates based on an output signal of the delta-sigma modulator according to increase of the output level may be increased much more. Accordingly, the delta-sigma modulator included in the Class-S structure transmitter apparatus may be desirable to design to have three output levels.

Figure 5:
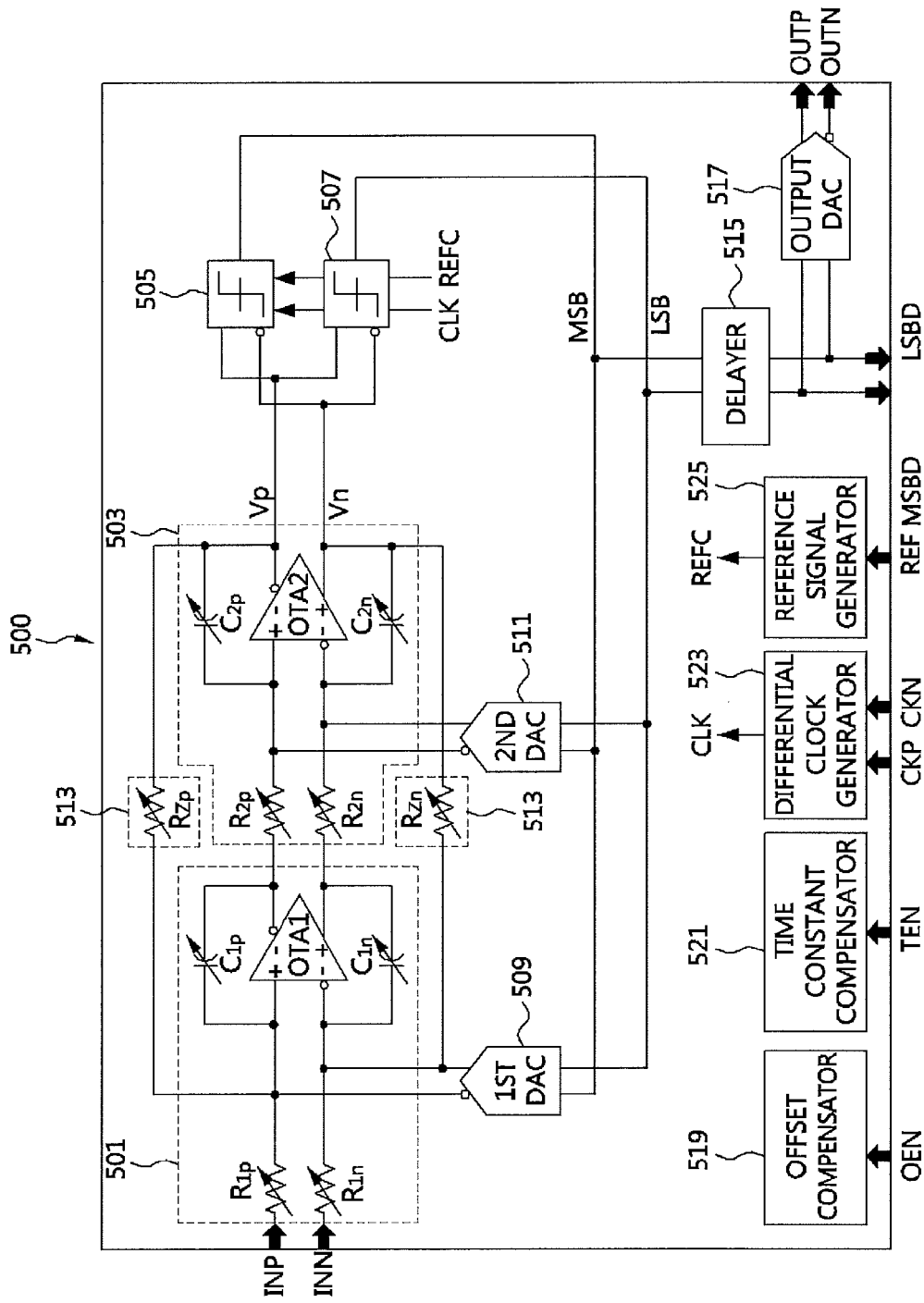
FIG. 5 is a circuit diagram illustrating a structure of a delta-sigma modulator according to an embodiment of the inventive concept.

FIG. 5 is a circuit diagram illustrating a structure of a delta-sigma modulator according to an embodiment of the inventive concept.

Referring to FIG. 5, the delta-sigma modulator 500 according to an embodiment of the inventive concept may include a first integrator OTA1 501, a second integrator OTA2 503, a first comparator 505, a second comparator 507, a first digital to analog converter (DAC) 509, a second DAC 511, a zero optimizer 513, a delayer 515, an output DAC 517, an offset compensator 519, a time constant compensator 521, a differential clock generator 523, and a reference signal generator 525.

The first integrator 501 may integrate an analog input signal INP and INN, and an output signal of the first DAC 509, and the second integrator 503 may integrate the output signal of the first integrator 501 and an output signal of the second DAC 511 to output an output signal Vp and Vn.

The first integrator 501 and the second integrator 503 may include resistors and capacitors, and values of the resistors and the capacitors may be varied according to control of a time constant compensator 521 to consistently maintain a time constant.

The first comparator 505 may compare the output signal Vp and Vn of the second integrator 503 and a reference signal REFC and output a first digital signal MSB (most significant bit) corresponding to a comparison result, and the second comparator 507 may compare the output signal Vp and Vn of the second integrator 503 and the reference signal REFC and output a second digital signal LSB (least significant bit) corresponding to a comparison result.

The first comparator 505 and the second comparator 507 may operate based on a clock signal CLK provided from the differential clock generator 523, and compare the reference signal REFC provided from the reference signal generator 525 and the output signal Vp and Vn provided from the second integrator 503.

The first DAC 509 may convert digital signals MSB and LSB output from the first and second comparators 505 and 507 into a corresponding analog signal, and feed the converted analog signal back to the first integrator 501.

The second DAC 511 may convert the digital signals MSB and LSB output from the first and second comparators 505 and 507 into a corresponding analog signal, and feed the converted analog signal back to the second integrator 503.

Meanwhile, a zero optimization in the delta-sigma modulator 500 may not have a great effect on an entire transmitter apparatus including the delta-sigma modulator 500. However, in the state of having similar signal quality, since the ACLR characteristics are improved as the SQNR is increased, the delta-sigma modulator 500 according to an embodiment of the inventive concept may further include the zero optimizer 513 which forms a negative feedback path from an output side of the second integrator 503 to an input side of the first integrator 501.

The delayer 515 may delay the digital signals MSB and LSB provided from the first and second comparators 505 and 507 by a predetermined time to output delayed signals MSBD and LSBD. Since the delayed signals are provided to the output DAC 517, a delay generated in the delta-sigma modulator 500 may be compensated.

The output DAC 517 may output signals OUTP and OUTN having three voltage levels corresponding to the delayed signals MSBD and LSBD output from the delayer 515. Here, three voltage levels may be desirable to be set to have 0 V, a reference voltage Vref, and two times the reference voltage 2×Vref, and the reference voltage Vref may be desirable to be set based on a voltage which can be processed in the mixer (840 of FIG. 7).

The offset compensator 519 may compensate the generated offset (for example, DC offset) due to a mismatch between devices according to a process and a design.

The time constant compensator 521, when values of the resistors and/or the capacitors included in the first and second integrators 501 and 503 are varied according to a process, supply voltage, and temperature (PVT) variations, may sense the variation to generate a compensation control signal corresponding to the sensed variation, control the varied values of the resistors and/or the capacitors in response to the compensation control signal, and then consistently maintain a time constant.

The differential clock generator 523 may generate a clock for an operation of the first and second comparators 505 and 507. For example, when a frequency band of a signal input to the delta-sigma modulator 500 is 20 MHz and an OSR is set to be 13.056, since a sampling frequency may be 522.24 MHz, the differential clock generator 523 may generate a clock frequency of 522.24 MHz.

The reference signal generator 525 may generate a bias voltage needed for an operation of each component of the delta-sigma modulator 500, and/or a reference signal REFC used as a comparison reference in the first and second comparators 505 and 507.

Figure 6:
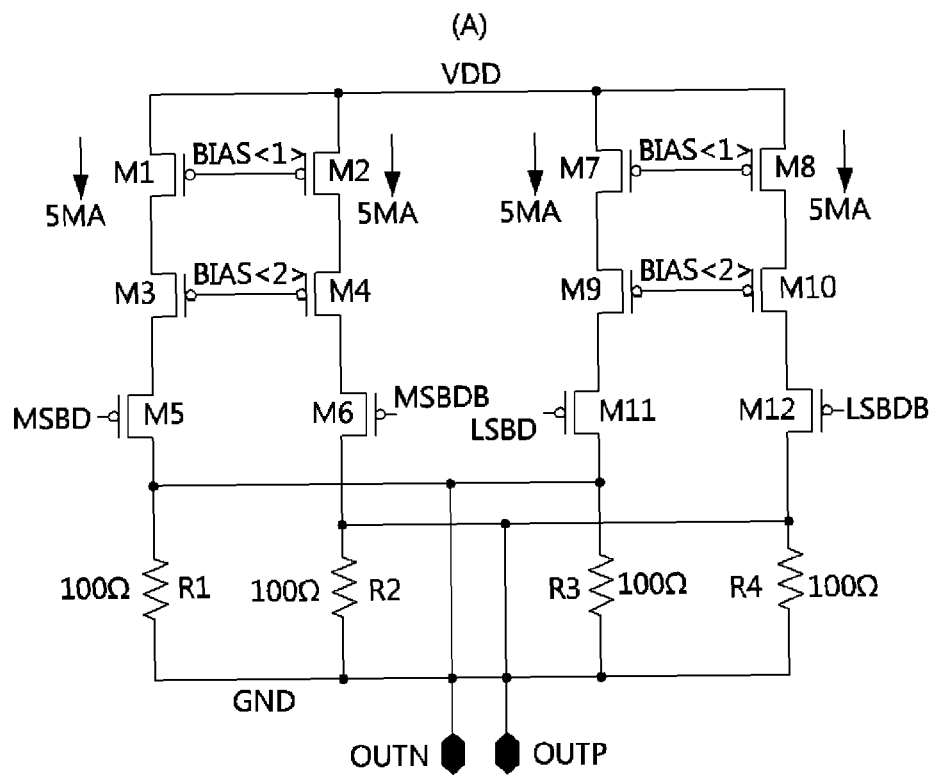
FIG. 6 is a circuit diagram illustrating a structure of an output digital-analog converter (DAC) shown in FIG. 5.
Figure 6:
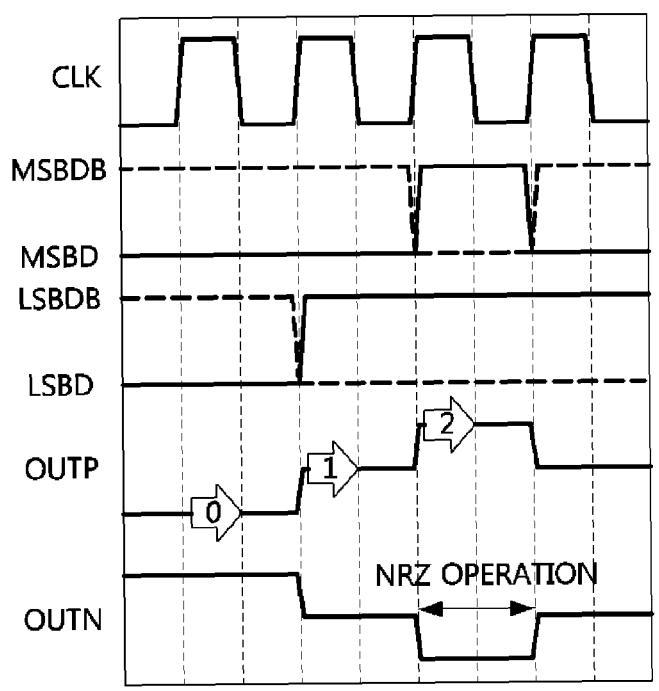

FIG. 6 is a circuit diagram illustrating a structure of the output digital-analog converter (DAC) shown in FIG. 5. In FIG. 6, (a) is a circuit diagram illustrating a detailed structure of the output DAC 517, and (b) is a timing diagram explaining an operation of the output DAC 517.

Referring to FIG. 6, the output DAC 517 may consist of a plurality of transistors M1 to M12 and a plurality of resistors R1 to R4. The transistors M5, M6, M11, and M12 may have a turned on or off state in response to the delayed signals MSBD and LSBD output from the delayer 515 to control currents flowing through the resistors R1 to R4, and then generate the output signals OUTP and OUTN having three voltage levels.

For example, when the delayed signals MSBDB and LSBDB are a logic "high", the transistors M6 and M12 may have a turned off state, and output a voltage having a first level (for example, 0 V) as the output signal OUTP.

Further, when at least one of the delayed signals MSBDB and LSBDB is a logic "low", one transistor to which the logic "low" is applied of the transistors M6 and M12 may have a turned on state, the other transistor to which the logic "high" is applied of the transistors M6 and M12 may have a turned off state, and then the output signal OUTP having a voltage of a second level (for example, Vref V) may be output.

Moreover, when the delayed signals MSBDB and LSBDB are a logic "low", the transistors M6 and M12 may have a turned on state, and output a voltage having a third level (for example, 2×Vref V) as the output signal OUTP.

As shown in FIGS. 5 and 6, the delta-sigma modulator 500 according to an embodiment of the inventive concept may be the optimized to configure a delta-sigma modulator 500 for the Class-S structure transmitter apparatus based on the simulation results of FIGS. 1 to 4.

Firstly, the delta-sigma modulator 500 according to an embodiment of the inventive concept may be implemented to have a high OSR in order to obtain high ACLR characteristics, and may be constituted as a continuous-time type delta-sigma modulator. Since the continuous-time type delta-sigma modulator 500 may operate at a clock frequency higher that of a discrete-time type delta-sigma modulator, the continuous-time type delta-sigma modulator 500 may use the differential clock generator 523 in order to operate at a high clock frequency, in the inventive concept.

Further, since the delta-sigma modulator 500 according to an embodiment of the inventive concept is implemented to have a second order structure including two integrators, two comparators, and two negative feedback DACs and an output of three voltage levels starting from 0 V, when the delta-sigma modulator 500 is applied to a Class-S structure transmitter apparatus for transmitting a signal having a wide frequency band such as an LTE, performance of the transmitter apparatus may be maximized.

Moreover, in order to compensate non-ideal characteristics which can occur by a manufacturing process, a design structure, a temperature, a bias voltage, etc., the delta-sigma modulator 500 according to an embodiment of the inventive concept may include the delayer 515, the offset compensator 519, and the time constant compensator 521, control a signal applied to a power amplifier (850 of FIG. 7) using the delayed signals MSBD and LSBD output from the delayer 515. Accordingly, the delay generated by a supply voltage of the power amplifier may be solved.

Figure 7:
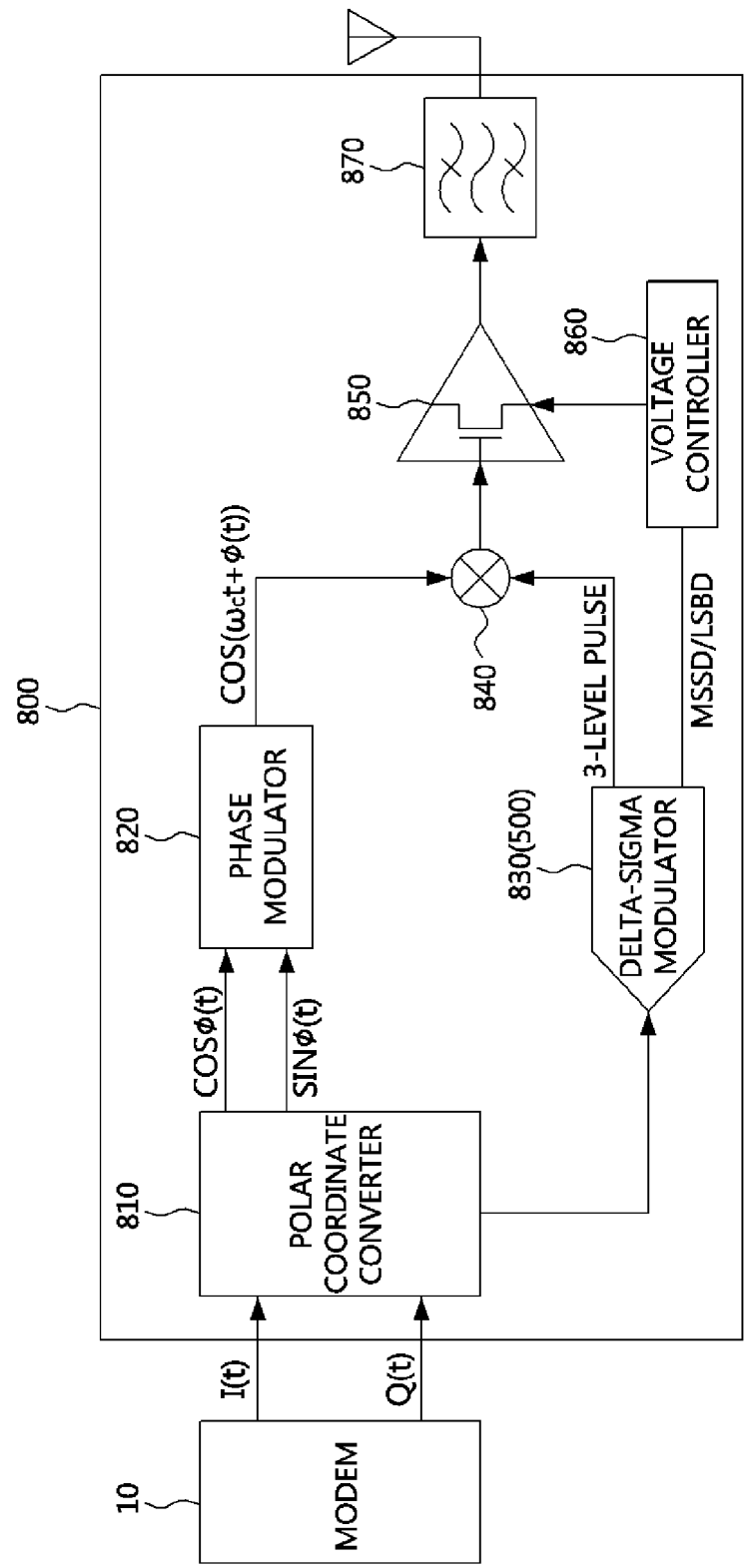
FIG. 7 is a block diagram illustrating a structure of a transmitter apparatus according to an embodiment of the inventive concept.

FIG. 7 is a block diagram illustrating a structure of a transmitter apparatus according to an embodiment of the inventive concept.

Referring to FIG. 7, the transmitter apparatus 800 according to an embodiment of the inventive concept may include a polar coordinate converter 810, a phase modulator 820, a delta-sigma modulator 830, the mixer 840, the power amplifier 850, a voltage controller 860, and a filter 870.

The polar coordinate converter 810 may receive baseband signals (I(t), Q(t)) from a modem 10, convert the received signals into a polar coordinate signal, and output a phase signal and an envelope signal.

The phase modulator 820 may perform phase modulation on the phase signal provided from the polar coordinate converter 810, and output the phase modulated signal which is a radio frequency (RF) having a constant amplitude.

The delta-sigma modulator 830 may perform delta-sigma modulation on the envelope signal provided form the polar coordinate converter 810, and output a pulse-width modulated signal having three levels. Here, since the delta-sigma modulator 830 may be equal to the delta-sigma modulator 500 shown in FIGS. 5 and 6, detailed description of the delta-sigma modulator 830 may be omitted.

The mixer 840 may mix the phase modulated signal provided from the phase modulator 820 and the pulse-width modulated signal having the three levels provided from the delta-sigma modulator 830. Here, an output signal of the mixer 840 may have a sine wave type having 0 or a constant amplitude, and drive the power amplifier 850 in a saturation mode.

The power amplifier 850 may perform power amplification on the output signal of the mixer 840.

The voltage controller 860 may control a provision time point of a supply voltage applied to the power amplifier 850 based on the delayed signals MSBD and LSBD provided from the delta-sigma modulator 830, and then the signal delay generated by the power amplifier 850 due to the supply voltage may be compensated.

The filter 870 may be constituted by a band pass filter, perform band pass filtering on a signal output from the power amplifier 850, and then remove out-of-band quantization noise.

Figure 8:
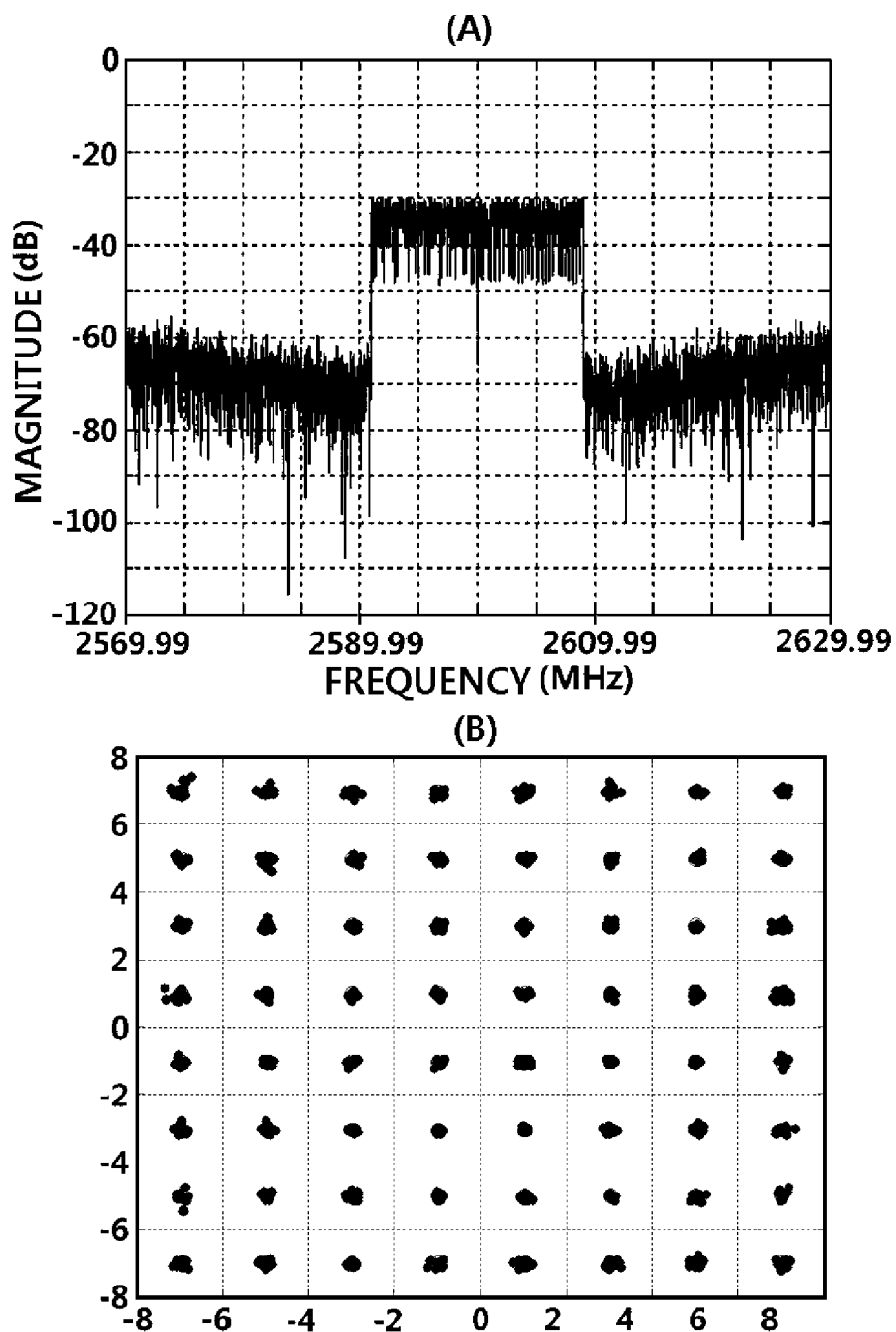
FIG. 8 is a graph illustrating an evaluation result of quality characteristics of a transmitter apparatus according to an embodiment of the inventive concept.

FIG. 8 is a graph illustrating an evaluation result of quality characteristics of a transmitter apparatus according to an embodiment of the inventive concept. In FIG. 8, (a) illustrates ACLR characteristics of a Class-S structure transmitter apparatus, and (b) illustrates EVM characteristics thereof.

As shown in FIG. 8, the transmitter apparatus including the delta-sigma modulator 500 or 830 according to embodiments of the inventive concept may show performance that the ACLR is 43.15 dB and the EVM is 1.68% with respect to an input signal with a PAPR of 8.5 dB and a bandwidth of 20 MHz. These characteristics may mean that the delta-sigma modulator 500 or 830 according to embodiments of the inventive concept is appropriate for the Class-S structure transmitter apparatus for transmitting a broadband signal.

As described above, according to the delta-sigma modulator and a transmitter apparatus including the same, the delta-sigma modulator may be constituted as a continuous-time type, and operate at a high clock frequency through the differential clock generator. Accordingly, the ACLR characteristics of the transmitter apparatus may be improved.

Further, performance of the transmitter apparatus for transmitting a broadband signal may be maximized by implementing the delta-sigma modulator which has a second order and outputs a pulse voltage having three voltage levels.

Moreover, the delta-sigma modulator and the transmitter may continuously stably operate and maximize efficiency, by implementing a component for compensating non-ideal characteristics which can occur according to a manufacturing process, a design structure, a temperature, a bias voltage, etc. in the delta-sigma modulator.

While the example embodiments of the present invention and their advantages have been described in detail, it should be understood that various changes, substitutions, and alterations may be made herein without departing from the scope of the invention.

What is claimed is:

1. A delta-sigma modulator, comprising:
   a first integrator configured to integrate an input signal and a first signal which is fed back;
   a second integrator configured to integrate an output signal of the first integrator and a second signal which is fed back;
   a first comparator configured to compare an output signal of the second integrator and a reference signal, and output a first comparison signal;
   a second comparator configured to compare the output signal of the second integrator and the reference signal, and output a second comparison signal;
   a first digital to analog converter (DAC) configured to output the first signal corresponding to the first comparison signal and the second comparison signal;
   a second DAC configured to output the second signal corresponding to the first comparison signal and the second comparison signal;
   a delayer configured to generate a delayed signal that delays the first comparison signal and the second comparison signal by a predetermined time; and
   an output DAC configured to generate an output signal having a multi-level corresponding to the delayed signal.

2. The delta-sigma modulator of claim 1, further comprising:
   a differential clock generator configured to generate a clock signal having a clock frequency corresponding to a bandwidth of the input signal and a predetermined oversampling ratio (OSR).

3. The delta-sigma modulator of claim 1, wherein the delta-sigma modulator is constituted as a continuous-time type that the first integrator and the second integrator include a resistor and a capacitor.

4. The delta-sigma modulator of claim 1, further comprising:
   a time constant compensator configured to compensate values of a resistor and a capacitor included in the first integrator and the second integrator.

5. The delta-sigma modulator of claim 1, further comprising:
   an offset compensator configured to compensate a DC offset.

6. The delta-sigma modulator of claim 1, further comprising:
   a zero optimizer configured to form a feedback path from an output of the second integrator to an input of the first integrator, and optimize a zero.

* * * * *